United States Patent [19]

Schropp et al.

[11] Patent Number: 5,414,321
[45] Date of Patent: May 9, 1995

[54] SURFACE-WAVE ARRANGEMENT HAVING A STRUCTURE FOR PREVENTING INTERFERING ACOUSTIC WAVE COMPONENTS

[75] Inventors: Isidor Schropp, Ernsgaden; Kimon Anemogiannis, Munich; Giuliano Visintini, Unterhaching, all of Germany

[73] Assignee: Siemens Aktiengesellschaft, Munich, Germany

[21] Appl. No.: 122,497

[22] PCT Filed: Mar. 26, 1992

[86] PCT No.: PCT/EP92/00679
§ 371 Date: Sep. 28, 1993
§ 102(e) Date: Sep. 28, 1993

[87] PCT Pub. No.: WO92/17937
PCT Pub. Date: Oct. 15, 1992

[30] Foreign Application Priority Data

Mar. 28, 1992 [DE] Germany .................. 41 10 401.3

[51] Int. Cl.$^6$ ............................................. H01L 41/08
[52] U.S. Cl. .......................... 310/313 R; 310/313 D; 310/326; 333/151
[58] Field of Search ........... 310/313 R, 313 B, 313 C, 310/313 D, 326; 333/151, 194

[56] References Cited

U.S. PATENT DOCUMENTS

| | | | |
|---|---|---|---|
| 3,872,410 | 3/1975 | Zucker | 333/151 |
| 3,956,647 | 5/1976 | Mitchell et al. | 310/313 B |
| 4,139,791 | 2/1979 | Yamada et al. | 310/326 X |
| 4,188,596 | 2/1980 | Miura | 333/151 |
| 4,354,129 | 10/1982 | Ieki | 310/313 C |
| 4,426,595 | 1/1984 | Kawaura et al. | 310/313 D |

FOREIGN PATENT DOCUMENTS

| | | |
|---|---|---|
| 0057598 | 8/1982 | European Pat. Off. |
| 57208719 | 12/1982 | European Pat. Off. |
| 2 131 614 | 12/1972 | Germany |
| 2450831 | 5/1977 | Germany |
| 2738192 | 2/1980 | Germany |
| 60-256214 | 12/1985 | Japan |
| 2048010 | 12/1980 | United Kingdom |

*Primary Examiner*—Mark O. Budd
*Attorney, Agent, or Firm*—Hill, Steadman & Simpson

[57] ABSTRACT

Surface-wave arrangement (1) having at least one surface structure (21, 22), by means of which those components of surface waves (19) which are produced in the arrangement are rendered ineffective with respect to interference which would otherwise occur, for which a sump is provided in a known manner at the end of the substrate.

11 Claims, 3 Drawing Sheets

SURFACE-WAVE ARRANGEMENT HAVING A STRUCTURE FOR PREVENTING INTERFERING ACOUSTIC WAVE COMPONENTS

BACKGROUND OF THE INVENTION

1. Field of the Invention

The present invention relates to a surface-wave arrangement which has interdigital transducers and, possibly, further structures on the surface of a piezoelectric substrate. The interdigital transducers are used to convert electrical signals into acoustic surface waves, and vice versa. Further structures can be resonator structures, reflector structures or even conversion structures, as are known from WO 89/02675.

2. Description of the Related Art

Acoustic waves, which are designated by the general term "surface waves" and are Rayleigh waves, Bleustein waves, surface-skimming bulk waves and the like, run on or in the surface or in the region close to the surface of the respective substrate body. Apart from aperture effects and diffraction effects, such acoustic waves run in a direction which is designated as the main wave propagation direction, having wave fronts which are transverse to this direction and are in a straight line corresponding to the transducers, the opposing direction also being included. Specifically, such acoustic waves are transmitted from an interdigital transducer in the direction and the opposing direction as the main wave propagation direction, unless this transducer is not specifically constructed as a unidirectional transducer.

The substrate body of such a surface-wave arrangement is a platelet, which is normally elongated, is rectangular or whose narrow sides are inclined with respect to the longitudinal edges of the platelet. Such an inclined direction makes it possible for acoustic waves which strike against this end edge of the platelet and run in the main wave propagation direction to be reflected back on this edge in a direction other than the main wave propagation direction. However, it is in general normal instead of this or in addition to this to fit a so-called sump on or to the substrate platelet in the region of a relevant end edge of the substrate platelet. The material of such a sump has the property of absorbing waves of the surface-wave arrangement which pass into the region of this sump, that is to say no longer allowing them to pass back into the structures which are fitted on the substrate surface.

From the documents GB-A-2,048,010, EP-0,057,598 and DE-B-2,738,192, it is known for the outer border of a spot of absorbent material which is fitted on the substrate surface to be given a specific shape, for example as a large-area triangle having a zig-zag edge or some other irregular shape. Another shape (DE-B-2,738,192, FIGS. 4, 5 and 6) is that having a sawtooth shape. If such a sawtooth-shaped edge faces the wave, total reflection effects are thus precluded (which occur in the case of the invention which is still to be described). A sawtooth shape along the rearward edge with respect thereto would be virtually insignificant, even if said edge were to satisfy the angle conditions for total reflection, since the wave is essentially already attenuated to virtually zero, anyway, at this location.

Such materials for acoustic absorption are plastics and the like which are crosslinked with solvents and whose evaporations continuously change the electrical characteristics of a surface-wave arrangement, even over a lengthy time. When the arrangement is in a closed housing, such a material is highly disadvantageous for high-quality arrangements.

Proposals have thus been made, specifically as cases for acoustic waves, to produce incisions, of arranged angle, in the arrangement in the material of the rearside of the substrate platelet (DE-B-2,450,831) or to cut angled notches into the edges of the substrate (DE-A-2,131,614). For a surface-wave arrangement having a piezoelectric layer on a non-piezoelectric substrate, JP-A-60-256214 proposes that the edge of this piezoelectric layer be allowed to run in a zig-zag. Apart from their small effectiveness, such measures are relatively costly.

A method which is very effective even without absorbent plastic and without incisions into the substrate material is specified in the document WO 89/02675, which has already been mentioned at the start. Said document describes a conversion structure which is a metallization of the substrate surface and comprises strip arrangements such as those which are also used for resonator arrangements and reflector arrangements. However, since these conversion structures are not a component of the actual surface-wave arrangement, these conversion structures are also located outside the region of the structures which determine the function of the surface-wave arrangement as a resonator or as a filter. Such a conversion structure has a dimensioning, which is described in greater detail in the document, serves for the purpose of, and results in an acoustic surface wave running in the surfaces of the substrate body being converted into a volume wave, that is to say being deflected out of the surface of the substrate body into its volume, and disappearing there in the mass body of the substrate wafer.

The reason for the known use of a sump, inclined ends of the substrate, of incisions into the substrate or of a conversion structure is to prevent surface waves which would otherwise be reflected in an undesirable manner on the edges of the substrate body occurring and causing interference when they pass back into the actual structures of the surface-wave arrangement, for example of a filter, in particular allowing undesired signals to occur in the locking region of such a filter. Inclined ends of the substrate platelet specifically cannot be used in the same way as the measure intended here, particularly when the surface-wave arrangement is a multi-track arrangement in the case of which surface waves run in a first track having one main wave propagation direction and in a second track having the same main wave propagation direction, but offset parallel, and, possibly, in further parallel tracks. The substrate edge which is directed in an inclined manner would then have a negative effect, specifically in that surface-wave components of the one track striking against this edge would be reflected into the other track. It should be noted that such multi-track arrangements can also have tracks which deliberately run in an inclined manner, which is, for example, a measure for electro-acoustic coupling of such parallel tracks. Filters of such a type are known from WO 90/03690, WO 90/03692 and WO 90/03691 and JP-A-57-208719. In FIG. 2 of the last-mentioned document, a triangular reflector coating is used for the purpose of converting the transducer which is adjacent to this coating into a transducer which is unidirectional irrespective of the frequency. In this case, consideration has also been given to total reflection, for which purpose, however, a material would first have to be found whose total reflection angle is greater than 45°. The double 45° reflection of the wave is, specifically, a precondition for achieving the unidirectional effect of the transducer. A further example of this document relates to the use of such triangular reflectors as means for coupling the waves of two adjacent tracks of the wave exploitation in one respective surface-wave arrangement. In this context, DE-A-3,811,989 should also be mentioned, which specifies metallization structures whose inclined-angle edges are used for such inclined directions of the waves in a convolver.

SUMMARY OF THE INVENTION

The object of the present invention is to replace and/or further additionally to support the known measures for suppressing interfering surface-wave components in a surface-wave arrangement. In particular, such measures based on experience are intended to produce little stress on the substrate surface since the material of the substrates which are used for surface-wave arrangements is very costly and/or a structural form which is as small as possible is desired.

For a surface-wave arrangement having surface-wave structures which are provided on a substrate body for the operation of the arrangement, the invention makes it possible for the interfering occurrence of those acoustic wave components which are derived from surface waves and run in a predetermined manner in a main propagation direction in the surface-wave arrangement to be prevented, or at least quite considerably reduced. Thus, using the invention, those wave components which run and pass to the edge of the substrate body (as are overcome, for example, in a known manner in a sump) of the waves which serve the actual function of the surface-wave arrangement as surface structures which are used as filters, as resonators or the like (transducers, resonators, reflectors and the like) are influenced such that, as far as possible, they cannot pass back again into the structures which form the actual surface-wave arrangement. In contrast to the way in which this is achieve using a conversion structure according to WO 89/02675, the present invention ensures, with the aid of a surface structure which is provided according to the invention and is still to be explained in more detail, that those surface-wave components which are to be overcome (and which pass to the edge of the substrate) are reflected back in such a manner and to such an extent that they can no longer cause interference. Particularly in the case of multi-track arrangements, it is ensured that these reflections are directed such that interference in the actual track and interference in the adjacent tracks are precluded.

It is provided according to the invention for a surface-wave arrangement which is defined above that in order to solve the problem, which has likewise already been specified above, this surface-wave arrangement (in addition to the structures which are essential to the function and are used for the actual operation of this arrangement) has at least one surface structure outside the region of such structures which are essential to the function, which surface structure has at least one boundary, which runs at an angle with respect to the main propagation direction of the acoustic waves of the structures which are essential to the function, is preferably essentially a straight line and separates the region of this surface structure which is provided on the substrate body, and the region of the substrate surface which is covered by this surface structure, from a region of the substrate body which is adjacent thereto, these surface waves having a propagation speed $v_1$ in the region of the said surface structure, and the propagation speed of these waves in the said adjacent region being $v_2$, which is different to $v_1$. According to the invention, this said boundary runs at an angle $\beta$ with respect to the main propagation direction, this angle $\beta$ being less than or equal to $0.8 \times \beta_g$ and such that, as an approximation:

$\beta_g = v_2 : v_1$ if $v_2$ is less than $v_1$, and $\beta_g = v_1 : v_2$ if $v_1$ is less than $v_2$.

(the latter case being the norm for the invention).

The surface structure which is provided according to the invention is arranged such that the surface waves which are predetermined by the structures of the surface-wave arrangement which are essential to the function, in the region of the lower propagation speed, strike against the boundary with the region having the largest speed.

BRIEF DESCRIPTION OF THE DRAWINGS

This essence of the invention and further refinements of the invention are explained in more detail to the person skilled in the art, with reference to the attached figures, in which.

DETAILED DESCRIPTION OF THE PREFERRED EMBODIMENTS

Figure 1:
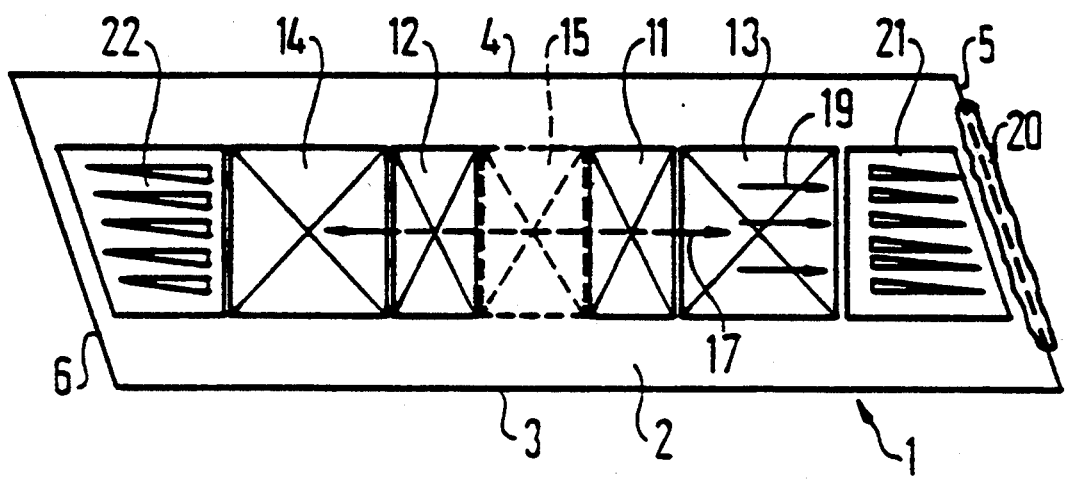
FIG. 1 shows an overview of an example of a surface-wave arrangement having a surface structure according to the invention.

The surface-wave arrangement 1 in FIG. 1 is an arrangement, which is known per se, of surface-wave structures as are known as the components which are essential to the function of, for example, a reflector filter. The substrate 2 on whose surface these surface-wave structures are located is an elongated platelet having longitudinal edges 3 and 4 and having two narrow sides or end edges 5 and 6 which are directed in an inclined manner at the angle α. Two interdigital transducers are shown schematically at 11 and 12, which are used as an input transducer and as an output transducer. 13 and 14 designate reflector structures which comprise strip structures. The interdigitally arranged fingers of the transducers 11 and 12 and the reflector strips of the reflectors 13 and 14 are normally arranged such that they are aligned at right angles to the main wave propagation direction 17 which results therefrom. The wave fronts of the acoustic waves which occur in such a surface-wave arrangement are at right angles to this direction 17. The propagation of such a flat acoustic wave on or in the surface of the substrate 1 is indicated by 19 in FIG. 1.

15 designates an additional structure which can alternatively be provided in order to fill the intermediate space between the input transducer and the output transducer 11, 12. Details on the sense and purpose of such a structure 15 can be found, for example, in EP-A-0,189,106.

21 and 22 designate surface structures of the substrate 1 which are provided according to the invention and are used to influence those wave intensity components which, originating from the waves designated by 19, pass through the right-hand side end of the reflector structure 13 in FIG. 1 into the surface structure 21. In the absence of a surface structure 21 such as that according to the invention, such wave intensity components would reach the edge 5 of the substrate 1.

According to the prior art, they would then be absorbed to a greater or lesser extent by a sump, which is indicated by 20, specifically in order to prevent it being possible for an interfering component to pass back from this edge 5 into the region of the surface-wave structures 11 to 14 which are essential to the function of the surface-wave arrangement. A sump such as that shown at 20 is composed, according to the prior art, of organic material, for example of an adhesive which is applied. As is known, such materials are in principle undesirable in the interior of the housing in which such a surface-wave arrangement is located in a hermetically sealed manner.

Conversion structures are described in WO 89/02675, which can be used instead of such a sump 20, to be precise in a surface region of the substrate 1 in which, in the case of the present invention, the surface structures 21 and 22 according to the invention are located.

The physical method of operation and the dimensioning rules for this surface structure according to the invention have already been explained in the preceding description.

Figure 2:
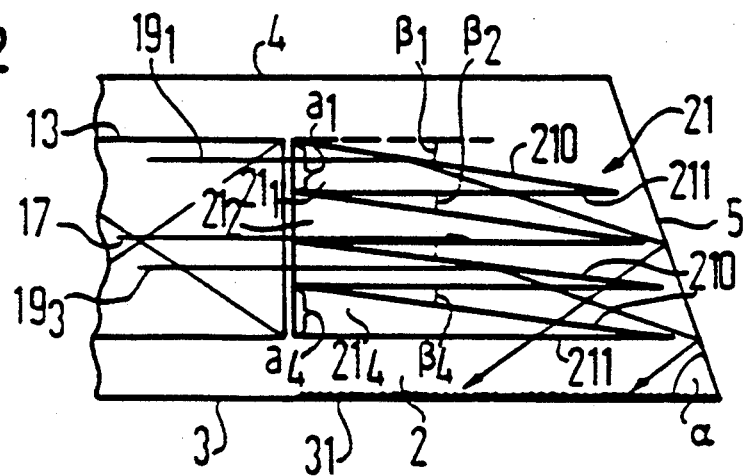
FIGS. 2, 2a show details of an embodiment of a surface structure according to the invention, showing part of the view in FIG. 1.

FIG. 2 shows a section of the view in FIG. 1, from which it can be seen in detail how the surface structure 21 is constructed. It comprises, for example, four acute-angled surface coatings of the surface of the substrate 1. These are preferably metal coatings, composed in particular of a metal such as that which is also used for the fingers or strips of the surface-wave structures 11 to 14 which are essential to the function. These acute-angled coatings are designated by $21_1$ to $21_4$. As can be seen from the figure, the tip ends of the coatings of the surface structure 21 extend to close to the inclined edge 5 of the substrate 1. In consequence, the substrate surface which is available in addition to the area of the structures 11 to 15 is utilized in an optimum manner for the function of the surface structure 21 according to the invention.

A corresponding situation applies to the surface structure 22 of the opposite end of the substrate 1.

$\beta_1$ to $\beta_4$ designate the angular deviations of the edges 210 of the coatings $21_1$ to $21_4$ from the main wave propagation direction 17. As is shown by the examples $19_1$ and $19_3$, the surface wave 19 runs in the reflector 13, an intensity component of this wave 19 entering the surface structure 21 in an unbroken manner, via the right-hand side end of the reflector 13. The width dimensions of the coatings $21_1$ to $21_4$ at the boundary with the reflector 13 are designated by $a_1$ to $a_4$. This wave component $19_1$... runs parallel to the edges 211 of the surface structure 21.

The intensity components which strike against the edges 210 of the coatings $21_1$ to $21_4$, which edges are aligned at an acute angle at the angle $\beta$, are totally reflected on these edges, which are the boundaries designated above between two different regions. This results from the fact that the angles $\beta_1$ to $\beta_4$ are dimensioned to be less than the limiting angle $\beta_g$ for total reflection, at which a wave in a medium which is denser for this wave strikes against the boundary with a medium which is thinner for this wave. In the general case on which this argument is based, the acoustic wave has a lower propagation speed in the surface and in the region close to the surface of the substrate under the coatings $21_1$ to $21_4$. In the regions of the uncoated surface of the substrate, the wave propagation speed is higher. The dimensioning rule which is specified above on page 4 also takes into account the reverse case.

FIG. 2 shows how the wave components $19_1$ and $19_3$ are totally reflected on the edges or boundaries 210. Furthermore, the reflection of the totally reflected components on the edge 5 is shown. The refraction and reflection of the totally reflected components on the edges 211 of the surface structure 21 is disregarded in the figure. This is taken into account in practice, without this being essential to the function of the surface structure according to the invention.

For absorption of wave components which strike against the longitudinal side 3 of the substrate 2, this side surface or surfaces and another side surface or other side surfaces of the substrate can be roughened, as is indicated by 31, which results in greater scattering of the components which strike it or them.

As a result of the inclined alignment, which is matched to the inclined direction of the edge 5, of the tip ends of the coatings $21_1$ to $21_4$, in the case, for example, of equidistance widths $a_1$ to $a_4$, the angles $\beta_1$ to $\beta_4$ can be slightly different sizes, but they must always be less than the limiting angle $\beta_g$ for total reflection. It is recommended that the angle $\beta$ always be dimensioned to less than at least approximately $0.7 \times \beta_g$. However, an angle $\beta$ can be provided which is always constant, as a result of which the widths $a_1$ to $a_4$ are then of a somewhat different size to one another. It is not precluded for the edges 210 also to be able to deviate somewhat from the linear nature shown.

Figure 2A:
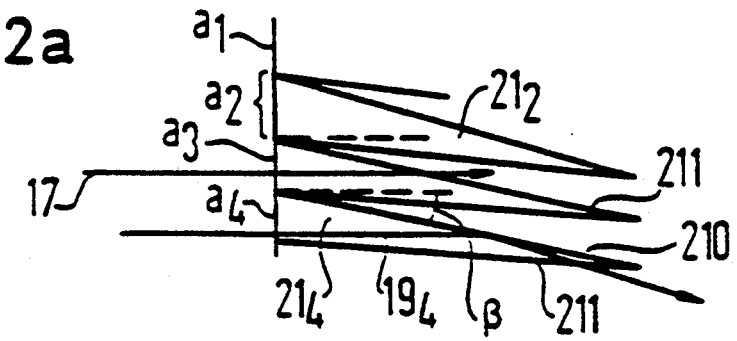

The view in FIG. 2a shows a design in which the edge 211 has an alignment which is not parallel to the main wave propagation direction 17, but is aligned in a "negative" angle, so that this edge 211 is not struck by the acoustic wave 19, even in FIG. 2a.

Figure 3:
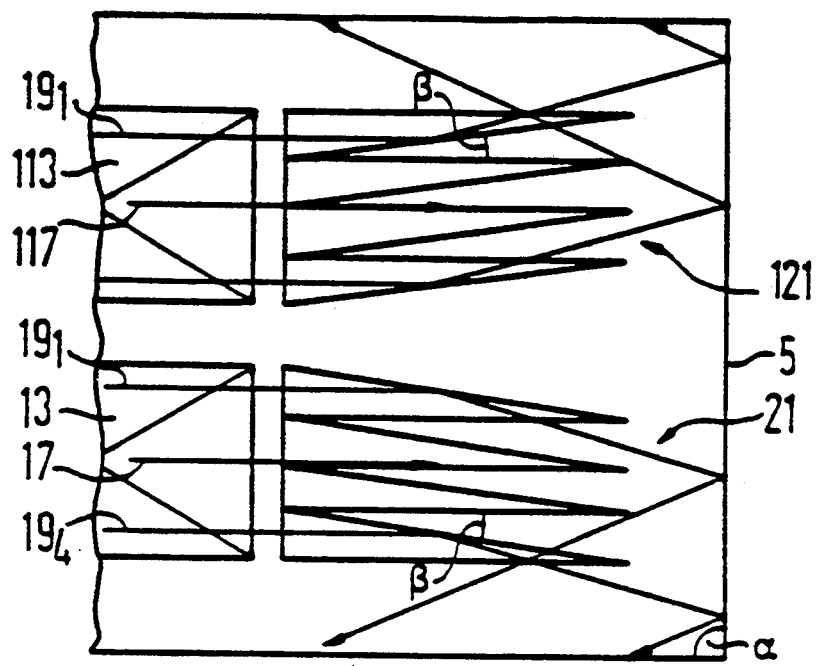
FIG. 3 shows part of the view corresponding to FIG. 2 of a surface-wave arrangement having two tracks and having two associated surface structures according to the invention.

FIG. 3 shows a two-track arrangement with the main wave propagation directions 17 and 117 of the two tracks of the surface-wave arrangement of this figure. The section which is shown in FIG. 3 corresponds to the section of FIG. 2 shown in FIG. 1. The reference symbols of the surface structure 21 in FIG. 3 have the same meaning as those in FIGS. 1 and 2. The surface structure 121 in FIG. 3 corresponds in principle to the surface structure 21, but the angle $\beta$ of the structure 121 is directed in the opposite direction to the angle $\beta$ of the structure 21.

As can be seen from FIG. 3, the wave components, which are totally reflected in the surface structures 21 and 121 provided according to the invention, are reflected away from the parallel main wave propagation directions 17 and 117 of the two tracks in opposite directions, so that crosstalk between the two tracks is very largely precluded.

Figure 4:
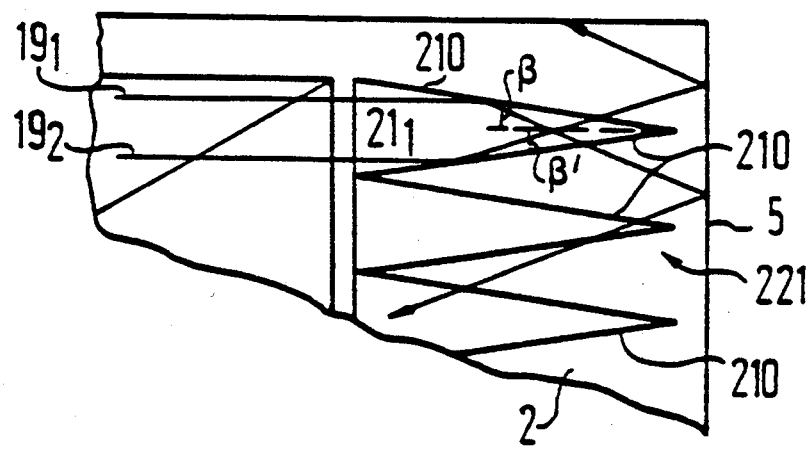
FIG. 4 shows a variant of a surface structure according to the invention.

FIG. 4 shows an embodiment as can be used alternatively for a surface-wave arrangement having only one track. The surface structure according to the invention is designated by 221. The edges and boundaries, which are critical to the operation, of the region of lower wave speed with respect to the region of higher wave speed are once again designated by 210. In principle, the triangular coatings $21_1$ of the surface structure 221 are coatings such as those designated in FIG. 2 by $21_1$ and so on, two such structures $21_1$ being joined to one another, back-to-back, by means of the edges 211. The deflecting effect of the edges 210 of the surface structure 221 for the surface wave 19 is shown by the sets of lines $19_1$ and $19_2$ shown in FIG. 4. The angles $\beta$ and $\beta'$ do not need to be of the same size, and they need conform only to the above rule.

The embodiments of the invention which are represented show surface structures 21, 121 and 221 which in each case comprise a plurality of such acute-angled triangles as surface coatings of the substrate. The larger the number of individual acute-angled triangular coatings for a predetermined width of the wave front 19 (width measured transversely with respect to the main wave propagation direction 17) is selected to be, the shorter the entire surface structure 21, 121, 221 can be dimensioned in the direction of the main wave propagation direction 17. This is advantageous with respect to a reduced length of the substrate platelet 2. However, on the other hand, the width dimension $a_1, a_2 \ldots$ may not be made small at will, in order to avoid having to accept diffraction effects and the like. The dimension a should be not less than one wavelength of the acoustic wave 19 of the surface-wave arrangement.

The bases of the calculation for dimensioning are as follows:

The required total reflection angle, and hence the maximum angle $\beta_g$, between the edge or boundary 210 and the main wave propagation direction 17 are obtained from the speeds of the acoustic wave in the respective regions:

$$\cos(\beta_g) = v_s/v_f$$

The speed ($v_f$) under the free surface of the substrate, and the speed ($v_s$) under the surface of the substrate which is coated with metal (21) are approximately linked to the coupling factor in the following relationship:

$$v_s = v_f * (1 - k^2/2)$$

The equation for the maximum angle is thus simplified to:

$$\cos(\beta_g) = 1 - k^2/2$$

The practical dimensioning of the angle $\beta$ of the surface structure must satisfy the following condition:

$\beta$ less than $\beta_g$, and hence less than $0.8\,\beta_g$ with a safety factor of 0.8.

Since the wave is once again refracted at the edge on emerging from the structure, this results in an insignificant reduction in the resulting deflection angle.

The following approximate angles result for present-day materials:

| Material | $k^2$ | $\beta_g(°)$ |
| --- | --- | --- |
| $LiTaO_3$-X,112redY | 0.0075 | 5 |
| $LiTaO_3$-36redY,X | 0.07 | 15.2 |
| $LiNbO_3$-128redY,X | 0.055 | 13.5 |
| $LiNbO_3$-YZ | 0.045 | 12.2 |

When the wave strikes against the edge 210 at a corresponding angle $\beta$, it is thus reflected away from the track in every case.

The critical advantage of this surface structure according to the invention is that it requires no further production process. The structure is produced in the same process as the filter layout.

Figure 5:
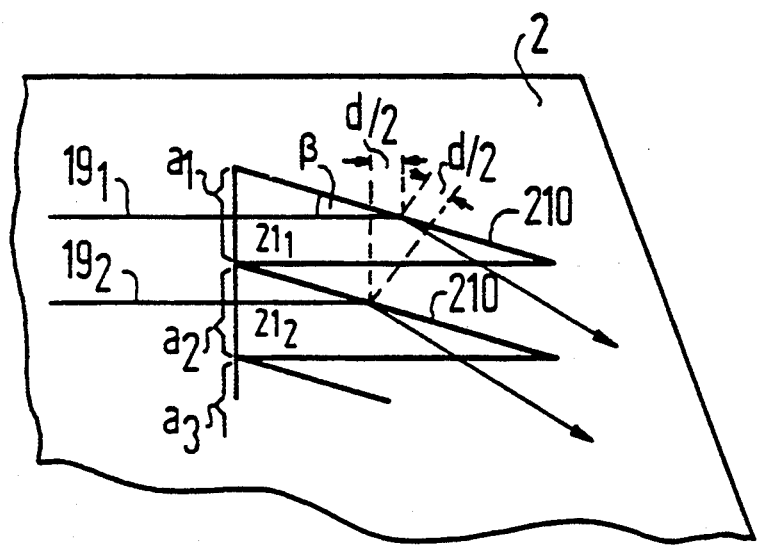
FIG. 5 relates to a further advantageous dimensioning.

It is particularly advantageous to select the angle $\beta$ such that wave components $19_1$ and $19_2$, which are introduced into the structure, of adjacent regions of widths $a_1$ and $a_2$ ($a_2$ and $a_c$ etc.) cancel one another out by interference, after reflection on the edges 210. This is shown in FIG. 5, in which this dimensioning of the angle $\beta$ is selected such that the length d, that is to say the path difference in adjacent regions 21 of totally reflected wave components $19_1$ and $19_2$ is equal, after their reflection, to half (the mean) wavelength of the wave under the respective coating $21_1, 21_2$. Subject to this condition, the two totally reflected beams shown in FIG. 5 cancel one another out.

Although other modifications and changes may be suggested by those skilled in the art, it is the intention of the inventors to embody within the patent warranted hereon all changes and modifications as reasonably and properly come within the scope of their contribution to the art.

We claim:

1. A surface wave arrangement on a piezoelectric substrate, comprising:

a surface structure for preventing acoustic wave components which cause interference in the surface-wave arrangement and are based on acoustic surface waves which run in a predetermined manner in a main wave propagation direction in the surface-wave arrangement, said surface structure having at least one essentially straight boundary, which runs at an angle $\beta$ to the main wave propagation direction and separates a first region of the surface structure from a second region, adjacent thereto, of a surface of the piezoelectric substrate, the surface wave having a first propagation speed (v1) in said first region of the surface structure, and a second propagation speed (v2) of the surface wave in the adjacent second region being different to v1, the angle $\beta$ of said at least one essentially straight boundary being less than or equal to approximately $0.8 \times \beta_g$, where:

$$\cos \beta_g = v_2/v_1 \text{ if } v_2 \text{ is less than } v_1, \text{ and}$$

$$\cos \beta_g = v_1/v_2 \text{ if } v_1 \text{ is less than } v_2$$

the surface structure being arranged such that the surface waves strike said at least one essentially straight boundary in a region of lower speed of the surface wave and are totally reflected on said at least one essentially straight boundary.

2. The surface-wave arrangement having a surface structure as claimed in claim 1, in which this surface structure comprises a plurality of acute-angled regions corresponding to the angle $\beta$ of the boundary.

3. The surface-wave arrangement having a surface structure as claimed in claim 2, having regions of the surface structure which have a width of equal size transversely with respect to the main wave propagation direction at the inlet end of the surface wave into this surface structure.

4. The surface-wave arrangement having a surface structure as claimed in claim 2, wherein said surface structure has a boundary perpendicular to the propagation direction at an end of the surface structure located at an inlet end of the surface wave into said surface structure.

5. The surface-wave arrangement having a surface structure as claimed in claim 2, having angles $\beta$ of the individual regions of the surface structure, which angles are of different size to one another, with a different length of the regions, measured in the direction of the main wave propagation direction.

6. The surface-wave arrangement having a surface structure as claimed in claim 2, having dimensions of the width of coatings of the surface structure, which dimensions are of different sizes to one another, at their end facing the center of the surface-wave arrangement.

7. The surface-wave arrangement having a surface structure as claimed in claim 1, having at least one further boundary of the region, which boundary is aligned essentially parallel to the main wave propagation direction.

8. The surface-wave arrangement having a surface structure as claimed in claim 1, having at least one region of the surface structure, which region is bounded by two boundaries which each run at an angle $\beta$ with respect to the main wave propagation direction.

9. A surface-wave arrangement having two tracks with surface structures as claimed in claim 1, whose boundaries which run at the angle $\beta$ with respect to the main wave propagation direction are aligned in such a manner that the components of the surface wave which pass into the respective surface structure in directions which are opposite one another with respect to the overall surface-wave arrangement are reflected with respect to the main wave propagation direction.

10. The surface-wave arrangement as claimed in claim 1, in the case of which the angle $\beta$ of the alignment of the totally reflecting edges is selected such that wave components which are totally reflected in adjacent regions cancel one another out by interference after the reflection has taken place.

11. A surface-wave arrangement as claimed in claim 1, wherein said surface structure is of a metallic material on a surface of said piezoelectric substrate.

* * * * *